(12) United States Patent
Zitzlsperger et al.

(10) Patent No.: US 9,165,913 B2
(45) Date of Patent: Oct. 20, 2015

(54) SEMICONDUCTOR COMPONENT, REFLECTED-LIGHT BARRIER AND METHOD FOR PRODUCING A HOUSING THEREFOR

(75) Inventors: Michael Zitzlsperger, Regensburg (DE); Thomas Zeiler, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 443 days.

(21) Appl. No.: 12/994,624

(22) PCT Filed: Apr. 17, 2009

(86) PCT No.: PCT/DE2009/000545
§ 371 (c)(1),
(2), (4) Date: Mar. 22, 2011

(87) PCT Pub. No.: WO2009/143797
PCT Pub. Date: Dec. 3, 2009

(65) Prior Publication Data
US 2011/0266559 A1    Nov. 3, 2011

(30) Foreign Application Priority Data
May 26, 2008  (DE) .......................... 10 2008 025 159

(51) Int. Cl.
| H01L 31/12 | (2006.01) |
| H01L 25/16 | (2006.01) |
| G01V 8/12 | (2006.01) |
| H01L 31/0203 | (2014.01) |
| H01L 31/167 | (2006.01) |

(52) U.S. Cl.
CPC ............. *H01L 25/167* (2013.01); *G01V 8/12* (2013.01); *H01L 31/0203* (2013.01); *H01L 31/167* (2013.01); *H01L 2924/0002* (2013.01)

(58) Field of Classification Search
USPC ............... 257/84, E33.077, E21.504; 438/25; 250/231.13
IPC .................. G01V 8/12; H01L 31/167, 31/0203, H01L 25/167
See application file for complete search history.

(56) References Cited

U.S. PATENT DOCUMENTS

| 4,285,730 A | * | 8/1981 | Sanford et al. .................. 501/44 |
| 4,309,605 A | | 1/1982 | Okabe |
| 5,040,868 A | | 8/1991 | Waitl et al. |
| 5,340,993 A | | 8/1994 | Salina et al. |
| 6,876,008 B2 | * | 4/2005 | Bhat et al. ........................ 257/99 |
| 2006/0016970 A1 | * | 1/2006 | Nagasaka et al. ........ 250/231.13 |
| 2006/0071150 A1 | | 4/2006 | Aizpuru |

(Continued)

FOREIGN PATENT DOCUMENTS

| DE | 26 56 185 | 6/1978 |
| DE | 196 00 678 | 7/1997 |

(Continued)

OTHER PUBLICATIONS

Abstract of Ono in English.*

(Continued)

*Primary Examiner* — Hrayr A Sayadian
(74) *Attorney, Agent, or Firm* — Cozen O'Connor

(57) ABSTRACT

The application relates to a semiconductor component, a photo-reflective sensor, and also a method for producing a housing for a photo-reflective sensor, wherein the housing lower part is monolithic and has at least two cavities into which an emitter and a detector are introduced.

13 Claims, 6 Drawing Sheets

(56) References Cited

U.S. PATENT DOCUMENTS

| | | |
|---|---|---|
| 2008/0297020 A1 | 12/2008 | Wanninger et al. |
| 2010/0000104 A1 | 1/2010 | Moellmer et al. |

FOREIGN PATENT DOCUMENTS

| | | | |
|---|---|---|---|
| DE | 102 14 121 | 12/2003 | |
| DE | 10 2005 061 798 | 4/2007 | |
| DE | 10 2006 016 523 | 10/2007 | |
| EP | 1 187 227 | 5/1989 | |
| EP | 0 493 051 | 7/1992 | |
| EP | 1 079 443 | 2/2001 | |
| JP | 58 093388 | 6/1983 | |
| JP | 04-252082 | 9/1992 | |
| JP | 08 130325 | 5/1996 | |
| JP | 08130325 A * | 5/1996 | H01L 31/12 |
| JP | 11-204827 | 7/1999 | |
| JP | 2001-156325 | 6/2001 | |
| JP | 2003-133498 | 5/2003 | |
| JP | 2005-311286 | 11/2005 | |
| JP | 2006-032566 | 2/2006 | |
| JP | 2006-038572 | 2/2006 | |
| JP | 2006-108294 | 4/2006 | |
| JP | 2007-189116 | 7/2007 | |
| JP | 2008-022006 | 1/2008 | |
| JP | 2008-072013 | 3/2008 | |

OTHER PUBLICATIONS

English Machine translation of Ono.*

* cited by examiner

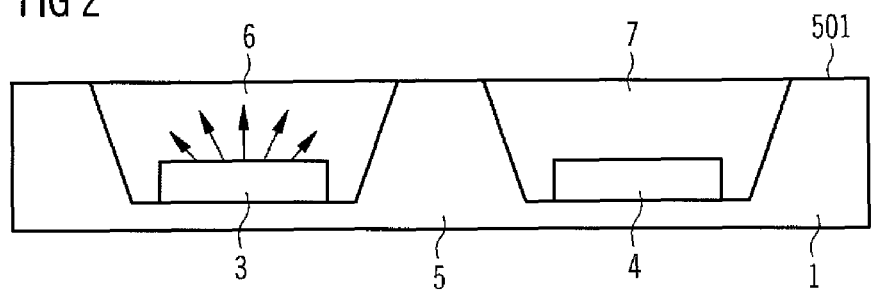
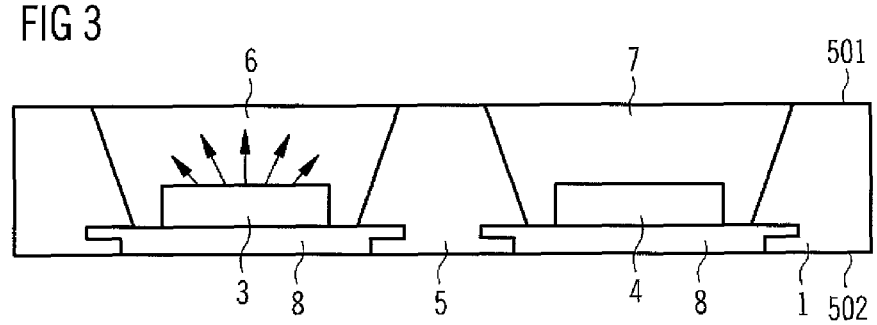
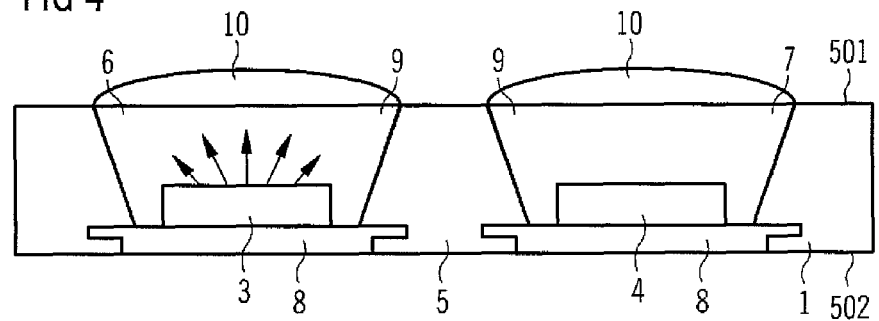

SEMICONDUCTOR COMPONENT, REFLECTED-LIGHT BARRIER AND METHOD FOR PRODUCING A HOUSING THEREFOR

This is a U.S. national stage of International Application No. PCT/DE2009/000545, filed on Apr. 17, 2009, and claims priority on German patent application No. 10 2008 025 159.3, filed on May 26, 2008, the disclosure content of which is hereby incorporated by reference.

FIELD OF THE INVENTION

The application relates to a semiconductor component, a photo-reflective sensor, and also a method for producing a housing, wherein a monolithic housing lower part is provided, which has at least two cavities and at least one semiconductor chip is in each case introduced in the cavities, wherein the housing lower part has an absorbent or reflective effect for an emitted electromagnetic radiation.

BACKGROUND OF THE INVENTION

Photo sensors are used for detecting objects within a specific region. A photo sensor is an electronic-optical system comprising an emitter and a detector. A semiconductor chip which emits an electromagnetic radiation is hereinafter considered to be an emitter. The emitter is also referred to as transmitter or radiation source. The emitting semiconductor chip can emit, for example, an infrared radiation or visible light and is preferably a light emitting diode or a laser diode. The detector, by contrast, is a semiconductor chip which detects an electromagnetic radiation, and which is also referred to as sensor or receiver. The detector is sensitive to the emitted radiation of the emitter. The detecting semiconductor chip is preferably a phototransistor, a photoresistor or a photodiode.

The functional principle of a photo sensor will be explained briefly below. The emitter emits an electromagnetic radiation in a specific wavelength range with a corresponding light intensity I. The detector is sensitive at least to this specific wavelength range of the radiation. The beam path between emitter and detector is altered by an object to be detected in the photo sensor. The resultant alteration of the impinging luminance of the radiation is registered in the detector. This registration is converted into an electrical switching signal in a subsequent step, said signal then being processed further.

The luminance L is defined as the ratio of the emitted light intensity I to the size A of its apparent luminous area. Luminance has the SI unit candela cd per square meter $m^2$. Luminance is the photometric equivalent to radiance $L(\lambda)$ having the unit watt*meter$^{-2}$*steradian$^{-1}$ or $W \cdot m^{-2} \cdot sr^{-1}$ in radiometry.

In the case of photo sensors, a distinction is made, in principle, between one-way photo sensors and photo-reflective sensors. In the case of one-way photo sensors, emitter and detector are opposite one another, wherein the main emission direction of the emitter lies directly in the direction of the detector. Accordingly, the detector constantly detects the luminance caused by the emitter. As soon as an object enters the beam path between emitter and detector, the beam path is interrupted. The resultant non-detection of the emitted radiation of the emitter is evaluated in a further-processing unit.

In the case of photo-reflective sensors, in contrast to the one-way photo sensor, emitter and detector are not opposite one another and are furthermore preferably situated in a common housing. As a result, the construction is less complex. In principle, in the case of photo-reflective sensors, a distinction is made between two methods for detecting objects.

In the case of the first method, a reflective element is arranged on a first side, and the housing with emitter and detector is arranged on an opposite side. The element and the housing are oriented in such a way that an interruption of the beam path by an object causes a change in luminance in the detector.

Alternatively, no reflector is used. If an object is in the beam path of the emitter, then the radiation of the emitter impinges on the object and is scattered at the object surface on account of the surface configuration of the object. As a result of the scattering, part of the emitted radiation will impinge on the detector. The change in the luminance in the detector is registered.

Detector and emitter are increasingly being accommodated on a carrier within a housing. If detector and emitter are accommodated in a housing, it is necessary to prevent a short-circuiting of the optical signal path. A direct beam path from emitter to detector should therefore be prevented. For this purpose, optical barriers have hitherto been introduced into the housing, said optical barriers being positioned between emitter and detector. Said barriers are subsequently introduced into the housing by means of adhesives. However, the adhesives used are transparent to the emitting electromagnetic radiation. Consequently, a short-circuiting of the optical signal path cannot be ruled out by said barriers.

Therefore, it is an object of the invention to provide a semiconductor component, a photo-reflective sensor, and also a method for producing a housing for a photo-reflective sensor which are realized in a very simple manner and prevent a direct short-circuiting of the optical signal path.

SUMMARY OF THE INVENTION

The object is achieved by means of the measures specified in the coordinate patent claims.

For this purpose, one aspect of the invention is directed to a semiconductor component comprising a monolithic housing lower part is provided. The housing lower part has a top side and at least a first and a second cavity, wherein the cavities are open toward the top side of the housing lower part. At least one semiconductor chip which emits an electromagnetic radiation is arranged into the first cavity. At least one semiconductor chip which detects an electromagnetic radiation is arranged in the second cavity. The housing lower part is composed of a material which absorbs or reflects the emitted electromagnetic radiation.

The monolithic, in other words integral, configuration of the housing lower part results in a good optical separation between emitting and detecting semiconductor chips. A short-circuiting of the optical signal path is now no longer possible. By virtue of the fact that the housing lower part is configured in monolithic fashion, there is no need to introduce any additional barriers with an adhesive into the housing arrangement. Consequently, the construction is realized simply and cost-effectively.

In a further configuration, the semiconductor component has a leadframe, on which semiconductor chips are arranged. The leadframe is non-transmissive to the radiation that is to be emitted or to be detected. In addition, the leadframe can be directly electrically conductively contact-connected through at least one side of the semiconductor component.

Since the emitting and the detecting semiconductor chips are also active on the rear side of the chip, and so radiation can also be emitted and respectively detected on the rear side of the chips, a leadframe shaped in this way prevents radiation that is to be emitted from being coupled into the detecting element on the rear side. If the leadframe is part of a printed circuit board, then its material is likewise absorbent or reflective with respect to the radiation that is to be emitted and to be detected. In addition, electrical contact-connection of the semiconductor chips is achieved by means of the leadframe.

In a further configuration, the housing lower part is produced by means of injection molding or transfer molding methods. These methods make it possible, in a very simple manner, to configure the housing lower part with the cavities without having to apply additional barriers into the housing lower part.

In a further configuration, a housing upper part is additionally provided, which is at least partly transparent to the radiation that is to be emitted and the radiation that is to be detected. Said housing upper part firstly provides protection of the semiconductor chips. In order to prevent the emitted and the detected electromagnetic radiation from being blocked, the housing upper part is at least partly transparent. In addition, the housing upper part results in improved optical coupling to the transmission medium air. Since the housing upper part is introduced directly into the cavities and the introduction results in a sufficient holding force between housing upper part and housing lower part, the use or the introduction of additional adhesives is not necessary. In conclusion, more cost-effective production of this semiconductor component is achieved.

In a further configuration, the housing upper part is additionally provided with an optical element. By way of example, a lens or else a lens array can be provided as the optical element. The radiation that is to be emitted and also the radiation that is to be detected are concentrated and/or deflected by the optical element. This leads to concentrated emission of the radiation on the emitter side, as a result of which the semiconductor component obtains a higher range. On the detector side, improved detection of the electromagnetic radiation is achieved by means of the optical element.

In a further configuration, the semiconductor component additionally has a third semiconductor chip in a third cavity of the housing lower part. In one particular configuration, said third semiconductor chip is an application specific integrated circuit (ASIC) or an electrostatic discharge (ESD) chip. Said third semiconductor chip controls firstly the emission of the electromagnetic radiation, for example by means of intensity control or modulation, and secondly the evaluation of the detected radiation. The third semiconductor chip can be potted by means of a covering compound, also designated as globe top.

In a further configuration, the third semiconductor chip is positioned on the leadframe as early as before the production of the housing lower part and is completely encapsulated with the material of the housing lower part by the injection molding method and transfer molding method, for example. The third semiconductor chip, which is possibly manipulated by the radiation, destroyed or functions incorrectly, is thus specifically protected against the radiation.

Provision is furthermore made for configuring a photo-reflective sensor with one of the semiconductor components already mentioned.

Furthermore, another aspect of the invention is directed to a method for producing a housing for a photo-reflective sensor is provided, comprising the following method steps:
providing a leadframe,
molding a first potting compound around the leadframe, in such a way that a monolithic housing lower part having at least a first and a second cavity arises, wherein the cavities are open toward a top side of the housing lower part,
positioning at least one semiconductor chip which emits an electromagnetic radiation within the first cavity,
positioning at least one semiconductor chip which detects an electromagnetic radiation within the second cavity,
electrically connecting the semiconductor chips to the leadframe.

This method can be realized in a more cost-efficient manner. Neither the introduction of barriers nor an additional adhesive is necessary in order to optically separate or isolate emitter and detector from one another. In addition, semiconductor components produced by this method have good performance characteristics.

The leadframe is, for example, etched, stamped or produced by means of a laser method. This form of production means that the leadframe is freely configurable within wide limits; in particular the number of cavities is not limited.

In a further configuration, a third semiconductor chip is firstly positioned on the leadframe and only in the subsequent step is the housing lower part produced. This makes it possible to mold around the third semiconductor chip without additional further potting compound. The use of materials which absorb or reflect the radiation that is to be emitted and/or detected means that the third semiconductor chip is decoupled from the electromagnetic radiation.

A second potting compound is additionally provided, which can be filled into the cavities and is at least partly transparent to the radiation that is to be emitted or that is to be detected. In a further configuration, the shaping of an optical element is possible by means of a compression molding method.

Exemplary embodiments of the invention are described below with reference to figures. In this case, the figures include identical or identically acting constituent parts having the same reference symbols. The elements illustrated should not be regarded as true to scale; rather individual elements may be illustrated with an exaggerated size or with exaggerated simplification, in order to afford a better understanding.

In the figures:

BRIEF DESCRIPTION OF THE DRAWINGS

FIG. 2 shows an exemplary embodiment of a semiconductor component with a monolithic housing lower part, FIG. 3 shows a development of the exemplary embodiment illustrated in FIG. 2, FIG. 4 shows a development of the exemplary embodiment illustrated in FIG. 3.

The functional principle of a photo-reflective sensor is provided in FIGS. 1a and 1b. FIG. 1a illustrates a semiconductor component 1 comprising a semiconductor chip 3 which emits an electromagnetic radiation, designated hereinafter as emitter, and a semiconductor chip 4 which detects an electromagnetic radiation, designated hereinafter as detector. Preferably, a laser diode or a light emitting diode is used as emitter. The wavelength of the emitted radiation is flexible, in principle. Ideally, the detector detects radiation emitted by the emitter. As a result, the emitted radiation and the reflected radiation have the same spectral range at least in part. Preferably, a phototransistor, a photodiode or a photoresistor can be used as detector semiconductor chip 4. A detailed description of detector and emitter is omitted at this juncture.

DETAILED DESCRIPTION OF THE DRAWINGS

If no object is situated in the range of the photo sensor, the emitted electromagnetic radiation is not reflected or scattered, as a result of which the detector semiconductor chip 4 detects no radiation. In FIG. 1b, an object 2 is now situated in the beam path of the semiconductor component 1. At the object 2, the impinging radiation is scattered and at least partly reflected back onto the detector semiconductor chip 4.

In principle, a second method for realizing a photo sensor is also possible, wherein a reflector is present instead of the object, as a result of which firstly a radiation is always detected in the semiconductor chip 4. If an object then appears between reflector and semiconductor component 1, the beam path is at least partly interrupted, as a result of which the radiation intensity is changed. This change is detected in the detector.

Figure 1A:
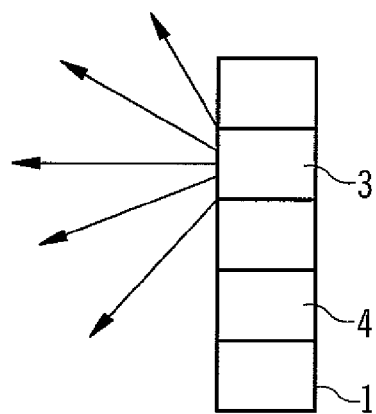
FIGS. 1a and 1b show a functional principle of a photo-reflective sensor.
Figure 1B:
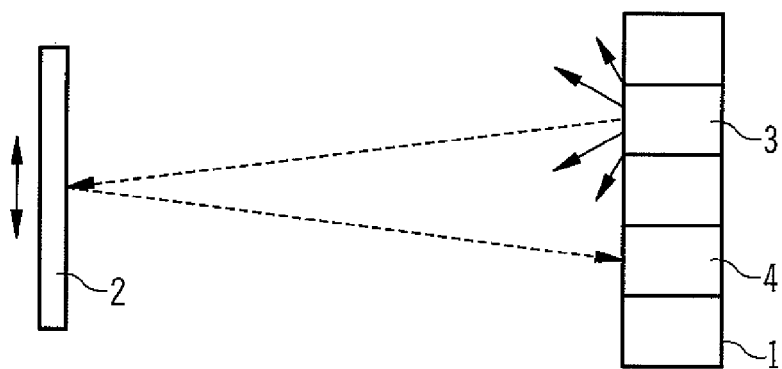

FIG. 2 illustrates a cross section of a semiconductor component 1 illustrated in FIG. 1. In this respect, the semiconductor component has a housing lower part 5. Said housing lower part is constructed in monolithic fashion, that is to say in integral fashion. It has a first cavity 6 and a second cavity 7. The emitter 3 is arranged in the first cavity 6. The detector 4 is arranged in the second cavity 7. The cavities 6 and 7 are open toward a top side 501 of the housing lower part 5.

The material of the housing lower part 5 is absorbent or reflective with respect to the electromagnetic radiation that is to be emitted. This means that the emitted electromagnetic radiation cannot penetrate through the housing lower part 5.

The material of the housing is preferably an epoxy resin or a hybrid compound consisting of silicone and epoxy. Alternatively, the housing material is a pure silicone molding compound. Said silicone molding compound contains fillers in order to adapt the mechanical and optical properties of the housing lower part 5 to the or to improve them. In principle, these molding compounds serve as an encapsulation for a leadframe and form the housing lower part of a semiconductor component, of a photo-reflective sensor or the like.

The monolithic shaping of the housing lower part means that a short-circuiting of the optical signal path between emitter 3 and detector 4 is not possible. Since the emitters and detector can emit radiation in all directions, infiltration of the housing lower part 5 is also precluded in this exemplary embodiment.

The monolithic shaping furthermore produces a more solid and stabler housing lower part than in the case of the conventional adhesive bonding of a barrier between the semiconductor chips 3 and 4. The housing is freely configurable within wide limits; in particular the number of cavities and the shaping thereof are not limited.

FIG. 3 illustrates a development of the exemplary embodiment illustrated in FIG. 2. Only the differences between FIG. 2 and FIG. 3 are discussed below. FIG. 3 additionally includes a leadframe 8, on which the emitter 3 and the detector 4 are arranged. The leadframe 8 is electrically conductively contact-connected through an underside 502 lying opposite the top side 501. Alternatively, the leadframe 8 can likewise be contact-connected via other sides of the housing lower part 5. Alternatively, a printed circuit board, often also designated as PCB, can also be used for the leadframe. The leadframe 8 and the PCB are, in particular, light-opaque to the radiation that is to be emitted or that is to be detected. As a result, infiltration via the housing underside 802 is likewise precluded.

In an alternative exemplary embodiment, the leadframe 8 is flexible and makes it possible, with a minimum of bonding connections, to combine a plurality of chips in one semiconductor component 3.

In order to produce an exemplary embodiment according to FIG. 3, firstly the leadframe 8 is stamped, etched or cut out by means of a laser. In the subsequent step, a first potting compound, for example an epoxy resin, a hybrid material or a silicone molding compound, is at least partly molded around the leadframe 8 by means of injection molding or transfer molding methods. In this case, cavities 6 and 7 are provided, which are open toward a top side 501. In the subsequent step, the emitter 3 and the detector 4 are electrically conductively connected to the leadframe 8.

FIG. 4 illustrates a development of the exemplary embodiment illustrated in FIG. 3. In this case, too, only the differences between FIG. 3 and FIG. 4 are discussed, in order to avoid repetition. In addition to FIG. 3, in FIG. 4 a housing upper part 9 is introduced into the first and second cavities 6 and 7. Said housing upper part is shaped as an optical element 10 in this exemplary embodiment. Said housing upper part 9 is preferably at least partly transparent to the electromagnetic radiation that is to be emitted and that is to be detected. By means of compression molding methods, this potting is introduced into the cavities 6 and 7, such that the optical element 10 arises. This obviates the additional application of lenses as optical element as an additional production step. A very precise alignment of chips and optical assembly is achieved by means of this arrangement.

Figure 5:
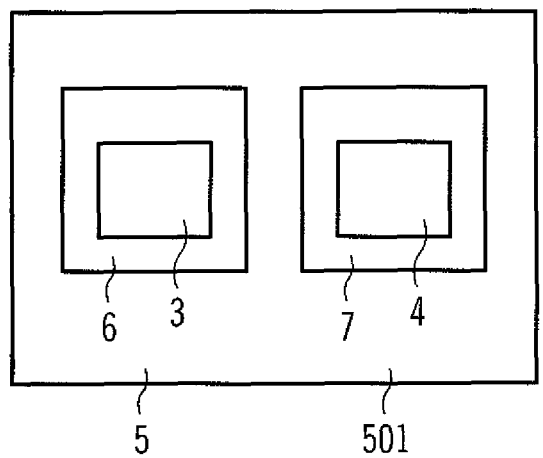
FIG. 5 shows a plan view of the exemplary embodiment illustrated in FIG. 2.

FIG. 5 illustrates a plan view of the exemplary embodiment illustrated in FIG. 2. In this case, the top side from FIG. 1 faces the viewer.

Figure 6:
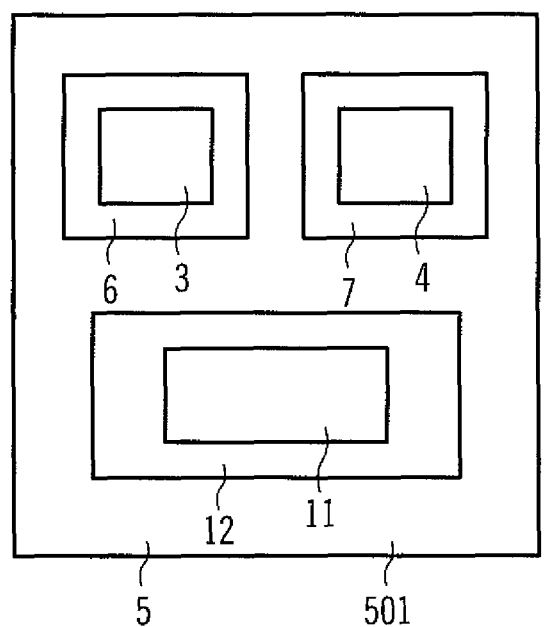
FIG. 6 shows a plan view of an alternative exemplary embodiment to FIG. 2.

FIG. 6 illustrates a development of the exemplary embodiment illustrated in FIG. 5. A third semiconductor chip 11 is introduced in a third cavity 12 of the housing upper part 5. Said third semiconductor chip 11 is preferably an ASIC or an ESD chip. The evaluation circuits of the detector 4 and also the guide circuits for the emitter 3 are integrated in the third semiconductor chip 11. By virtue of the embodiment illustrated in FIG. 6, a complete photo-reflective sensor can be produced cost-effectively using very simple means.

Figure 7:
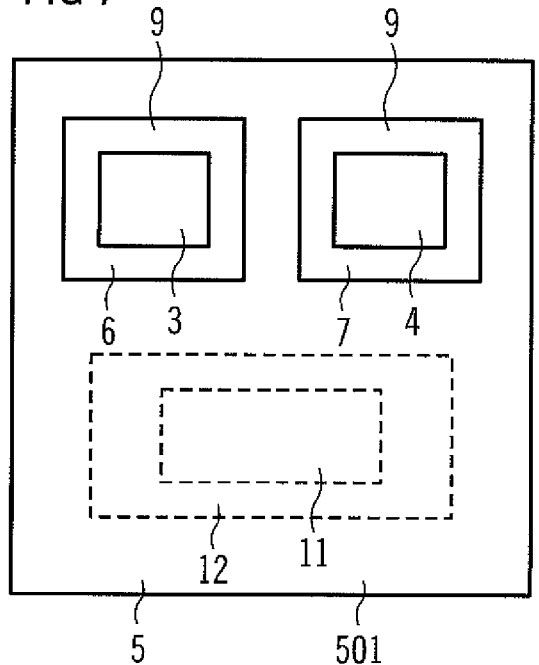
FIG. 7 shows a development of the exemplary embodiment illustrated in FIG. 6.

FIG. 7 illustrates a development of the exemplary embodiment illustrated in FIG. 6. In this case, the cavity 12 and the third semiconductor chip 11 are illustrated by dashed lines since the third cavity 12 and the third semiconductor chip 11 situated therein have already been encapsulated, or molded around, by means of the housing lower part 5. This molding-around process preferably takes place after the positioning of the third semiconductor chip 11 on the leadframe 8 and before the production of the housing upper part 5. As a result, the third semiconductor chip 11 is protected against the emitted radiation. This protection is necessary sometimes in order that the high-energy radiation cannot impinge on the third semiconductor chip 11. The semiconductor could be manipulated or destroyed by this irradiation. An additional globe top is not necessary in this embodiment, as a result of which a method step is once again saved. Subsequent measures for protection against the radiation can thus be obviated.

All of the variants illustrated result in very effective optical separation of transmitter and detector and additionally present a small space consumption. The mechanical strength is increased. In addition, in FIG. 7, the housing upper part 9 is introduced into the cavities 1 and 2.

Figure 8:
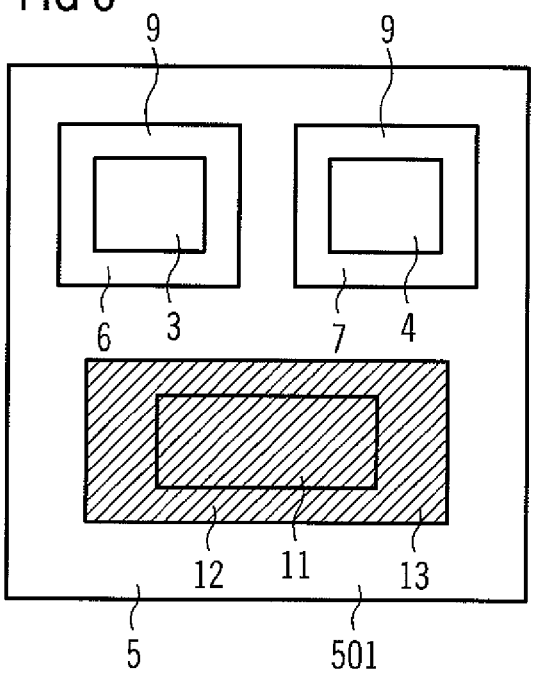
FIG. 8 shows an alternative to the exemplary embodiment illustrated in FIG. 7.

FIG. 8 illustrates an alternative exemplary embodiment to FIG. 7. Instead of the enveloping by means of the housing lower part 5, a globe top is introduced into the cavity 12 in order to protect the semiconductor chip 11 against the emitted radiation.

Figure 9:
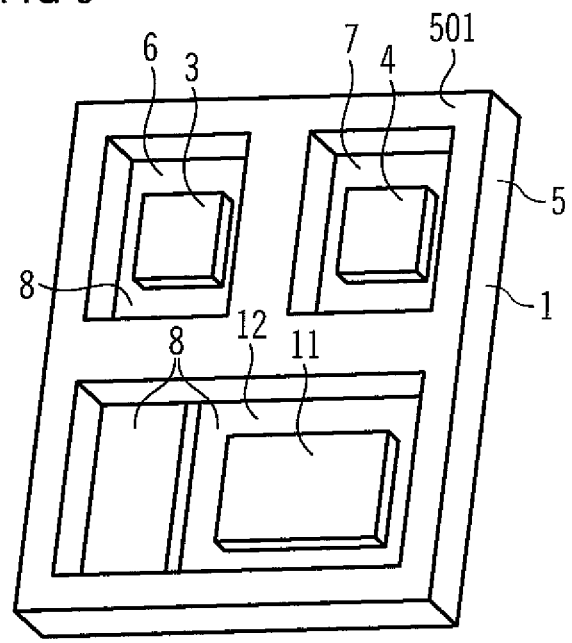
FIG. 9 shows a three-dimensional illustration of the exemplary embodiment illustrated in FIG. 2.
Figure 10:
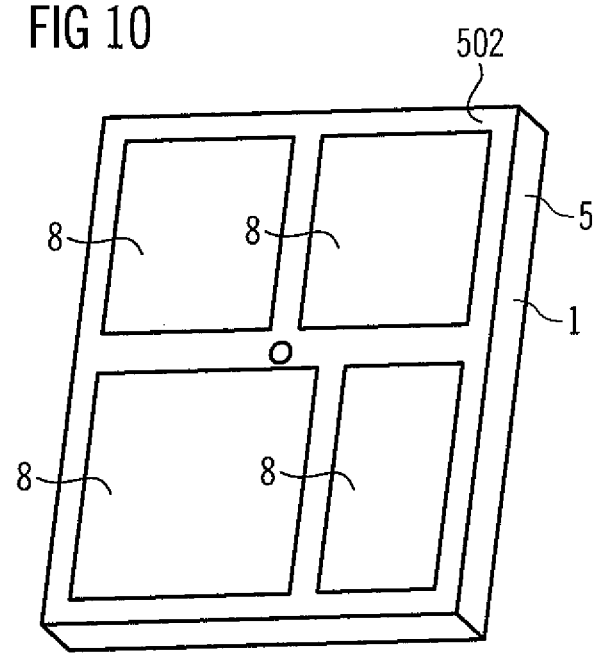
FIG. 10 shows a rear view of the exemplary embodiment illustrated in FIG. 9.

FIG. 9 illustrates a three-dimensional illustration of the exemplary embodiment illustrated in FIG. 6. FIG. 10 illustrates a rear view of the exemplary embodiment illustrated in FIG. 9. It can be seen that the leadframe 8 has large areas in order firstly to enable good electrical contact-connection, and secondly in order to prevent feedback of the emitted electromagnetic radiation into the detector 4 and hence a short-circuiting of the optical signal path.

Figure 11:
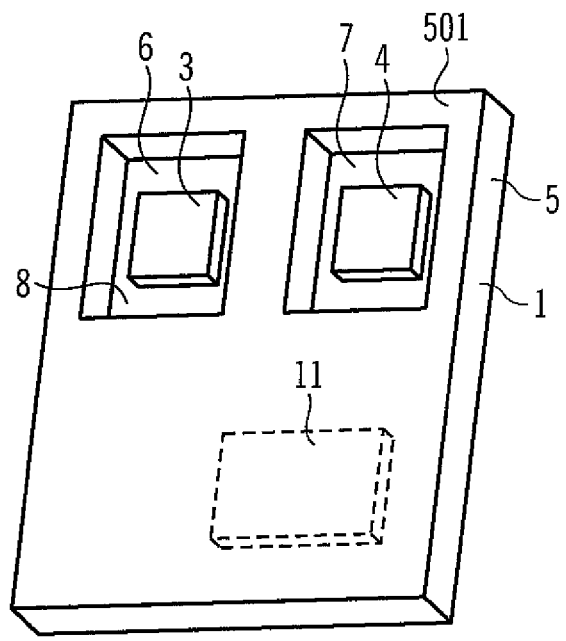
FIG. 11 shows a three-dimensional illustration of the exemplary embodiment illustrated in FIG. 7.
Figure 12:
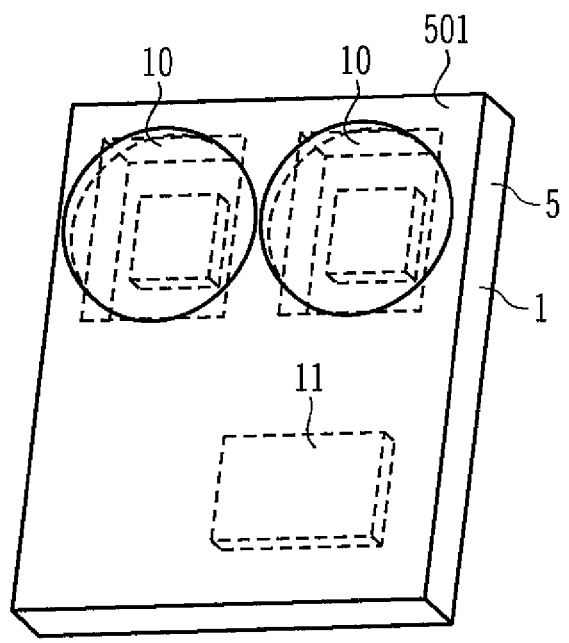
FIG. 12 shows a three-dimensional illustration of the exemplary embodiment illustrated in FIG. 11.

The exemplary embodiment illustrated in FIG. 7 is illustrated three-dimensionally in FIG. 11. FIG. 12 illustrates a three-dimensional depiction of the exemplary embodiment illustrated in FIG. 4. In this case, the optical elements 10 serve for improved and adapted beam directing and can concentrate, scatter and forward the electromagnetic radiation.

It is sometimes possible to accommodate a plurality of emitters 3 and also a plurality of detectors 4 in one semiconductor component 1. A Lambert emitter is preferably used as emitting and detecting semiconductor chip 3 and 4, respectively.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor component comprising:
a monolithic housing lower part wherein the housing lower part comprises:
a housing material;
a top side, and
at least a first and a second cavity, wherein the cavities are open toward the top side of the housing lower part;
at least one semiconductor chip which emits an electromagnetic radiation, wherein the emitting semiconductor chip is arranged in the first cavity;
at least one semiconductor chip which detects an electromagnetic radiation, wherein the detecting semiconductor chip is arranged in the second cavity; and
a third semiconductor chip which is completely encapsulated with the housing material, wherein the third semiconductor chip is an electrostatic discharge (ESD) chip or an application specific integrated circuit (ASIC) controlling the emitting of the electromagnetic radiation and the detecting of the electromagnetic radiation,
wherein the at least one semiconductor chip which emits the electromagnetic radiation, the at least one semiconductor chip which detects the electromagnetic radiation and the third semiconductor chip are arranged on a leadframe, the leadframe being non-transmissive to the electromagnetic radiation that is to be emitted and to be detected, the leadframe being electrically conductively contact-connectable via an underside of the semiconductor component lying opposite to the top side of the housing lower part, and
wherein the housing lower part is composed of a material that absorbs or reflects the emitted electromagnetic radiation.

2. The semiconductor component of claim 1, wherein the housing lower part is produced by means of injection molding methods or transfer molding methods.

3. The semiconductor component of claim 1, wherein the semiconductor component has a housing upper part, wherein the housing upper part is at least partly transparent to the radiation that is to be emitted and the radiation that is to be detected.

4. The semiconductor component of claim 3, wherein the housing upper part is an optical element.

5. The semiconductor component of claim 4, wherein the optical element is an individual lens or a lens array.

6. The semiconductor component of claim 1, wherein a third cavity is provided, which comprises the third semiconductor chip.

7. A photo-reflective sensor comprising the semiconductor component of claim 1.

8. A method for producing a semiconductor component, comprising the steps of:
providing a leadframe;
molding a first potting compound around the leadframe, in such a way that a monolithic housing lower part having at least a first and a second cavity arises, wherein the cavities are open toward a top side of the housing lower part;
positioning at least one semiconductor chip which emits an electromagnetic radiation on the leadframe within the first cavity;
positioning at least one semiconductor chip which detects an electromagnetic radiation on the leadframe within the second cavity;
electrically connecting the semiconductor chips to the leadframe; and
before the molding step, positioning a third semiconductor chip on the leadframe and electrically conductively connecting said third semiconductor chip to the leadframe, wherein the third semiconductor chip is an electrostatic discharge (ESD) chip or an application specific integrated circuit (ASIC) controlling the emitting of the electromagnetic radiation and the detecting of the electromagnetic radiation, and the first potting compound is molded completely around the third semiconductor chip in the molding step,
wherein the leadframe is non-transmissive to the electromagnetic radiation that is to be emitted and to be detected and the leadframe is electrically conductively contact-connectable via an underside of the semiconductor component lying opposite to the top side of the housing lower part.

9. The method of claim 8, wherein the cavities are potted by means of a second potting material, which is transparent to the radiation that is to be emitted and to be detected.

10. The method of claim 9, wherein the second potting material is additionally shaped as an optical element.

11. The method of claim 10, wherein the optical element is produced by means of a compression molding method.

12. The method of claim 8, wherein the first potting compound is an epoxy resin, a silicone comprising fillers or a mixture of epoxy resin and silicone comprising fillers.

13. A method for producing a semiconductor component, comprising the steps of:

providing at least one semiconductor chip which emits an electromagnetic radiation, at least one semiconductor chip which detects an electromagnetic radiation, and a leadframe which is non-transmissive to the electromagnetic radiation electromagnetic radiation that is to be emitted and to be detected;

providing a third semiconductor chip that is an electrostatic discharge (ESD) chip or an application specific integrated circuit (ASIC) controlling the emitting of the electromagnetic radiation and the detecting of the electromagnetic radiation;

positioning the third semiconductor chip on the leadframe and electrically conductively contact-connecting the third semiconductor chip to the leadframe;

molding a first potting compound around the leadframe in such a way that a monolithic housing lower part having at least a first and a second cavity arises, wherein the cavities are open toward a top side of the housing lower part, and in such a way that the first potting compound is molded completely around the third semiconductor chip in the molding step;

positioning the at least one semiconductor chip which emits an electromagnetic radiation on the leadframe within the first cavity;

positioning the at least one semiconductor chip which detects an electromagnetic radiation on the leadframe within the second cavity;

electrically connecting the at least two semiconductor chips to the leadframe;

filling a second potting material into the cavities, wherein the second potting material is transparent to the radiation that is to be emitted and to be detected, shaping the second potting material as an optical and element, wherein the production steps are performed in the indicated order.

* * * * *